(12) United States Patent
Oide et al.

(10) Patent No.: US 10,784,834 B2
(45) Date of Patent: Sep. 22, 2020

(54) LAMINATION TYPE LC FILTER ARRAY

(71) Applicant: TDK CORPORATION, Tokyo (JP)

(72) Inventors: Akihiko Oide, Tokyo (JP); Naoki Uchida, Tokyo (JP); Yoji Tozawa, Tokyo (JP); Makoto Yoshino, Tokyo (JP); Seiichi Nakagawa, Tokyo (JP); Shinichi Sato, Tokyo (JP); Hiroshi Ono, Tokyo (JP); Takashi Endo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/334,991

(22) PCT Filed: Aug. 21, 2017

(86) PCT No.: PCT/JP2017/029792
§ 371 (c)(1),
(2) Date: Mar. 20, 2019

(87) PCT Pub. No.: WO2018/070105
PCT Pub. Date: Apr. 19, 2018

(65) Prior Publication Data
US 2019/0280667 A1    Sep. 12, 2019

(30) Foreign Application Priority Data

Oct. 13, 2016 (JP) ................................ 2016-201776

(51) Int. Cl.
*H03H 7/01*    (2006.01)
*H03H 1/00*    (2006.01)
(Continued)

(52) U.S. Cl.
CPC ........... *H03H 7/0115* (2013.01); *H01F 17/00* (2013.01); *H01F 27/00* (2013.01); *H03H 1/00* (2013.01);
(Continued)

(58) Field of Classification Search
CPC ..................... H03H 2001/0085; H03H 7/0115
(Continued)

(56) References Cited

U.S. PATENT DOCUMENTS

2018/0061670 A1* 3/2018 Ishida ...................... H01G 4/30

FOREIGN PATENT DOCUMENTS

JP    2005-229219 A    8/2005

* cited by examiner

*Primary Examiner* — Rakesh B Patel
(74) *Attorney, Agent, or Firm* — Oliff PLC

(57) ABSTRACT

A multilayer LC filter array includes an element body of a rectangular parallelepiped shape, a first filter including a first inductor and a first capacitor, a second filter including a second inductor and a second capacitor, a first input terminal electrode and a first output terminal electrode that are connected to the first inductor, a second input terminal electrode and a second output terminal electrode that are connected to the second inductor, and a ground terminal electrode that is connected to the first capacitor and the second capacitor. The element body includes a principal surface. The ground terminal electrode is disposed at a center of the principal surface. The first input terminal electrode, the first output terminal electrode, the second input terminal electrode, and the second output terminal electrode are disposed at respective different corner portions of the element body when viewed from a direction orthogonal to the principal surface.

8 Claims, 12 Drawing Sheets

(51) Int. Cl.
    *H03H 7/075*    (2006.01)
    *H01F 17/00*    (2006.01)
    *H01F 27/00*    (2006.01)
(52) U.S. Cl.
    CPC ..... *H03H 7/075* (2013.01); *H03H 2001/0085* (2013.01)
(58) Field of Classification Search
    USPC .................................................. 333/175, 185
    See application file for complete search history.

LAMINATION TYPE LC FILTER ARRAY

TECHNICAL FIELD

The present invention relates to a multilayer LC filter array.

BACKGROUND ART

Known multilayer LC filter arrays include an element body, a first filter, a second filter, a first input terminal electrode and a first output terminal electrode, a second input terminal electrode and a second output terminal electrode, and a ground terminal electrode (for example, see Patent Literature 1). The element body of a rectangular parallelepiped shape includes a plurality of insulator layers laminated. The first filter includes a first inductor and a first capacitor that are disposed in the element body. The second filter includes a second inductor and a second capacitor that are disposed in the element body. The first input terminal electrode and the first output terminal electrode are connected to the first inductor. The second input terminal electrode and the second output terminal electrode are connected to the second inductor. The ground terminal electrode is connected to the first capacitor and the second capacitor.

CITATION LIST

Patent Literature

Patent Literature 1: Japanese Unexamined Patent Publication No. 2005-229219

SUMMARY OF INVENTION

Technical Problem

An object of one aspect of the present invention is to provide a multilayer LC filter array in which a parasitic inductance of a first capacitor and a parasitic inductance of a second capacitor are equivalent to each other.

Solution to Problem

A multilayer LC filter array according to one aspect of the present invention includes an element body, a first filter, a second filter, a first input terminal electrode and a first output terminal electrode, a second input terminal electrode and a second output terminal electrode, and a ground terminal electrode. The element body of a rectangular parallelepiped shape includes a plurality of insulator layers laminated. The first filter includes a first inductor and a first capacitor that are disposed in the element body. The second filter includes a second inductor and a second capacitor that are disposed in the element body. The first input terminal electrode and the first output terminal electrode are connected to the first inductor. The second input terminal electrode and the second output terminal electrode are connected to the second inductor. The ground terminal electrode is connected to the first capacitor and the second capacitor. The element body includes first and second principal surfaces opposing each other in a direction in which the plurality of insulator layers is laminated. The ground terminal electrode is disposed at a center of the first principal surface. The first input terminal electrode, the first output terminal electrode, the second input terminal electrode, and the second output terminal electrode are disposed at respective different corner portions of the element body when viewed from a direction orthogonal to the first principal surface.

In the multilayer LC filter array according to the aspect, the first input terminal electrode, the first output terminal electrode, the second input terminal electrode, and the second output terminal electrode are disposed at the respective different corner portions of the element body when viewed from the direction orthogonal to the first principal surface, and the ground terminal electrode is disposed at the center of the first principal surface. Therefore, distances between the ground terminal electrode and the first input terminal electrode, the first output terminal electrode, the second input terminal electrode, and the second output terminal electrode are equivalent to each other. Consequently, in the multilayer LC filter array according to the one aspect, the ground terminal electrode is common to the first filter and the second filter, and a parasitic inductance of the first capacitor and a parasitic inductance of the second capacitor are equivalent to each other.

In the multilayer LC filter array according to the one aspect, the first input terminal electrode, the first output terminal electrode, the second input terminal electrode, and the second output terminal electrode may each include a first electrode portions disposed on the first principal surface. An area of the ground terminal electrode may be larger than an area of each of the first electrode portions. This configuration improves mounting strength of the multilayer LC filter array, and stabilizes the posture at the mounting of the multilayer LC filter array, as compared with a configuration in which the area of the ground terminal electrode is less than or equal to the area of each of the first electrode portions.

In the multilayer LC filter array according to the one aspect, the first input terminal electrode, the first output terminal electrode, the second input terminal electrode, and the second output terminal electrode may be disposed only on one principal surface. The first input terminal electrode, the first output terminal electrode, the second input terminal electrode, and the second output terminal electrode may be connected to the corresponding first and second inductors and first and second capacitors via respective through-hole conductors. In this case, since all of the first input terminal electrode, the first output terminal electrode, the second input terminal electrode, the second output terminal electrode, and the ground terminal electrode are disposed only on one principal surface, the terminal electrodes are easily formed.

In the multilayer LC filter array according to the one aspect, the element body may further include four side surfaces. The first input terminal electrode, the first output terminal electrode, the second input terminal electrode, and the second output terminal electrode may each further include a second electrode portion disposed on a corresponding one of the side surfaces. The second electrode portion may be covered with an insulator. In this case, when the multilayer LC filter array is solder-mounted, solder fillets tend not to be formed on the side surfaces sides of the element body. Therefore, this configuration enables close adjacent high-density mounting of the multilayer LC filter array.

In the multilayer LC filter array according to the one aspect, the first filter may further include a third capacitor. The second filter may further include a fourth capacitor. The first capacitor may be connected to the first input terminal electrode, and the third capacitor may be connected to the first output terminal electrode. The second capacitor may be connected to the second input terminal electrode, and the fourth capacitor may be connected to the second output terminal electrode. In this case, since the first filter and the second filter constitute a π-type LC filter, a π-type LC filter array is implemented.

Advantageous Effects of Invention

The one aspect of the present invention provides the multilayer LC filter array in which the parasitic inductance of the first capacitor and the parasitic inductance of the second capacitor are equivalent to each other.

DESCRIPTION OF EMBODIMENTS

Figure 1:
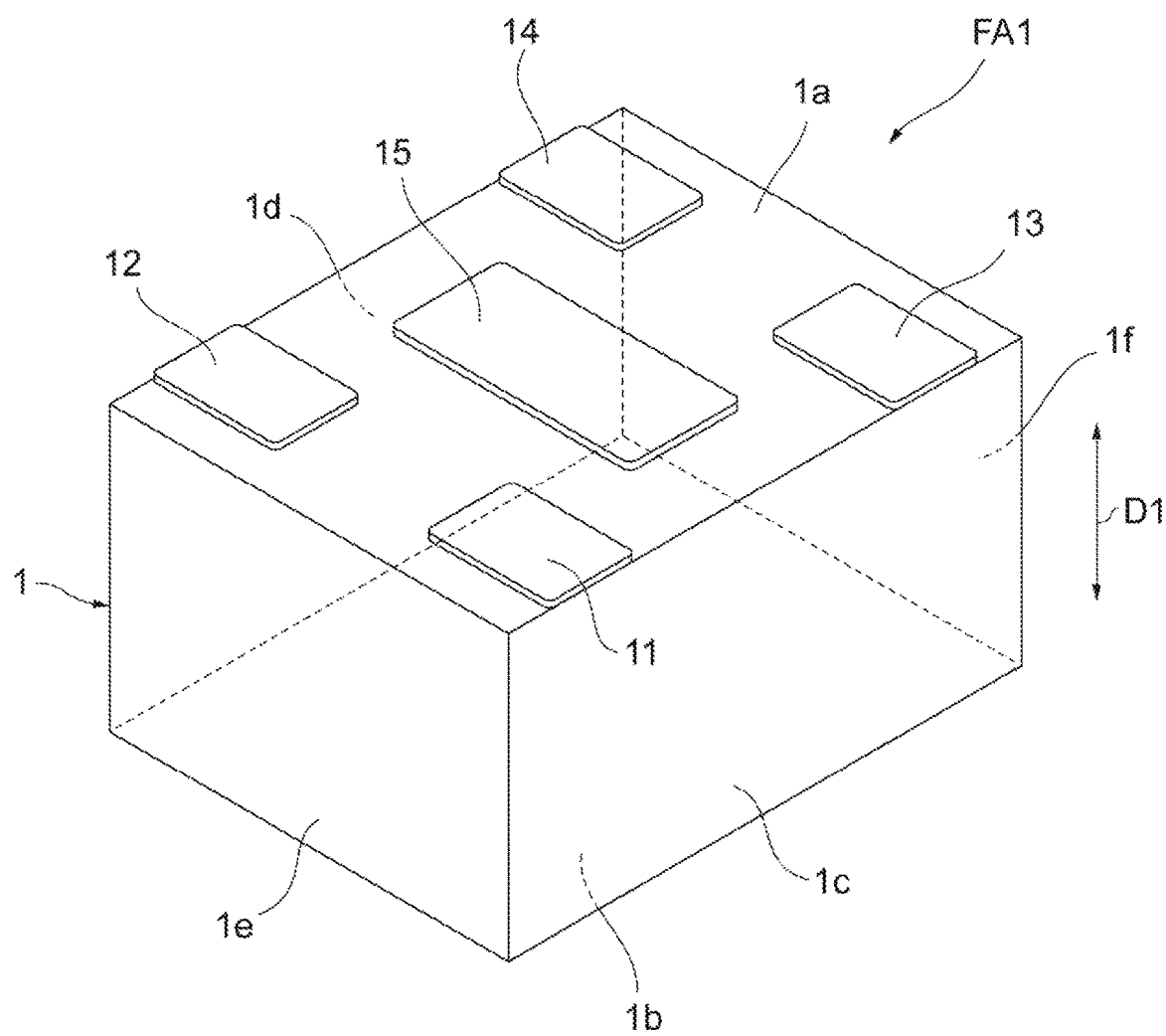
FIG. 1 is a perspective view illustrating a multilayer LC filter array according to a first embodiment.

Hereinafter, embodiments of the present invention will be described in detail with reference to the accompanying drawings. In the following description, the same elements or elements having the same functions are denoted with the same reference numerals and overlapped explanation is omitted.

First Embodiment

Figure 2:
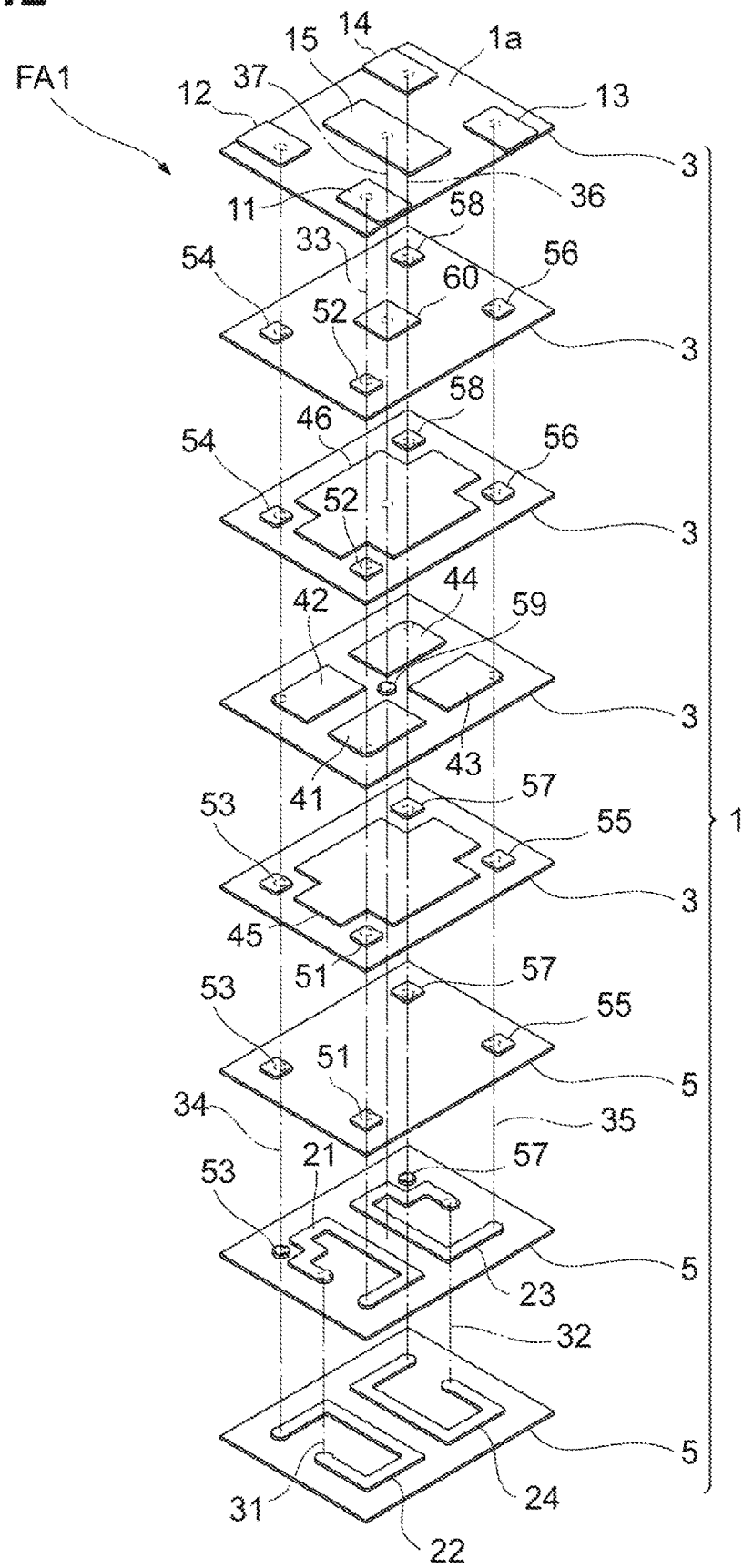
FIG. 2 is an exploded perspective view illustrating a configuration of the multilayer LC filter array according to the first embodiment.
Figure 3:
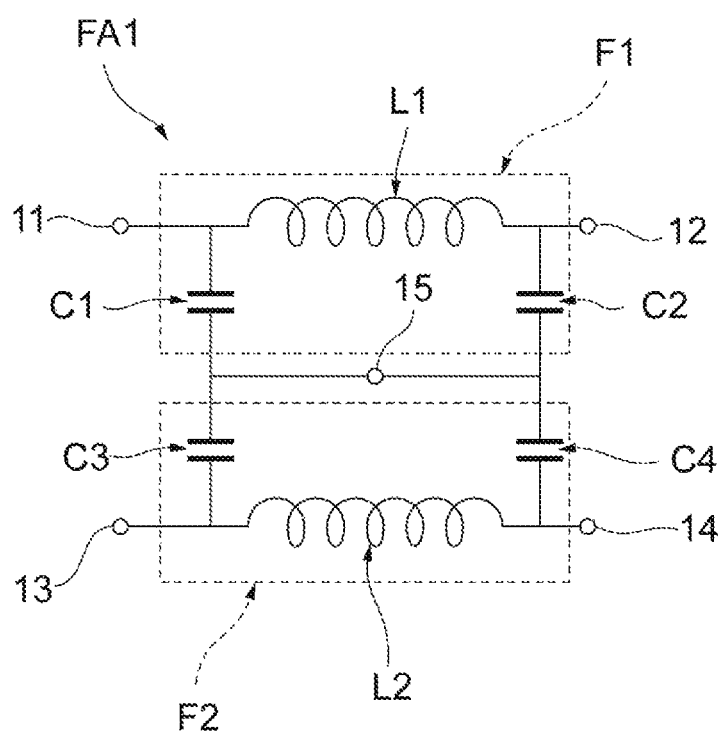
FIG. 3 is a diagram illustrating an equivalent circuit of the multilayer LC filter array according to the first embodiment.

With reference to FIGS. 1 to 3, a configuration will be described of a multilayer LC filter array FA1 according to a first embodiment. FIG. 1 is a perspective view illustrating the multilayer LC filter array according to the first embodiment. FIG. 2 is an exploded perspective view illustrating a configuration of the multilayer LC filter array according to the first embodiment. FIG. 3 is a diagram illustrating an equivalent circuit of the multilayer LC filter array according to the first embodiment.

As illustrated in FIG. 1, the multilayer LC filter array FA1 includes an element body 1 and a plurality of terminal electrodes 11, 12, 13, 14, and 15. The plurality of terminal electrodes 11, 12, 13, 14, and 15 is disposed on an outer surface of the element body 1. For example, the terminal electrodes 11 and 13 function as input terminal electrodes, the terminal electrodes 12 and 14 function as output terminal electrodes, and the terminal electrode 15 functions as a ground terminal electrode.

The multilayer LC filter array FA1 is mounted on an electronic device (for example, a circuit board or an electronic component). The terminal electrodes 11, 12, 13, and 14 are connected to respective signal lines. The terminal electrode 15 is grounded. The multilayer LC filter array FA1 is solder-mounted on the electronic device, for example.

The element body 1 has a rectangular parallelepiped shape. The element body 1 includes a first principal surface 1a and a second principal surface 1b opposing each other, a first side surface 1c and a second side surface 1d opposing each other, and a third side surface 1e and a fourth side surface 1f opposing each other. The first principal surface 1a and the second principal surface 1b each have a rectangular shape. In the multilayer LC filter array FA1, the first principal surface 1a is a mounting surface to oppose the electronic device. The rectangular parallelepiped shape includes a rectangular parallelepiped shape in which corners and ridges are chamfered, and a rectangular parallelepiped shape in which the corners and ridges are rounded.

The first side surface 1c and the second side surface 1d extend in a first direction D1 in which the first principal surface 1a and the second principal surface 1b oppose each other, to couple the first principal surface 1a and the second principal surface 1b. The first side surface 1c and the second side surface 1d extend also in a direction in which the third side surface 1e and the fourth side surface 1f oppose each other. The third side surface 1e and the fourth side surface 1f extend in the first direction D1 to couple the first principal surface 1a and the second principal surface 1b. The third side surface 1e and the fourth side surface 1f extend also in a direction in which the first side surface 1c and the second side surface 1d oppose each other. The first direction D1 is a direction orthogonal to the first principal surface 1a.

The element body 1 is configured by laminating a plurality of insulator layers 3 and 5 in the first direction D1. The element body 1 includes the plurality of insulator layers 3 and 5 laminated in the first direction D1. In the element body 1, a direction in which the plurality of insulator layers 3 and 5 is laminated coincides with the first direction D1. In the actual element body 1, the insulator layers 3 and 5 are integrated to such an extent that a boundary between the insulator layers 3 and 5 cannot be visually recognized.

The insulator layers 3 each include, for example, a sintered body of a ceramic green sheet containing a dielectric material (dielectric ceramic such as $BaTiO_3$-based, $Ba(Ti, Zr)O_3$-based, or $(Ba, Ca)TiO_3$-based). The insulator layers 5 each include, for example, a sintered body of a ceramic green sheet containing a magnetic material (such as Ni—Cu—Zn-based ferrite material, Ni—Cu—Zn—Mg-based ferrite material, or Ni—Cu-based ferrite material). The insulator layers 5 each may include a sintered body of a ceramic green sheet containing a nonmagnetic material (such as Cu-Zn-based ferrite material, dielectric material, or glass ceramic material).

The terminal electrodes 11, 12, 13, 14, and 15 are disposed on the first principal surface 1a. The terminal electrodes 11, 12, 13, 14, and 15 each have a rectangular shape when viewed from the first direction D1. The terminal electrodes 11, 12, 13, 14, and 15 each contain a conductive material (for example, Ag or Pd). The terminal electrodes 11, 12, 13, 14, and 15 each include a sintered body of a conductive paste containing a conductive material (for example, Ag powder or Pd powder).

The terminal electrode 11 is disposed at a corner portion defined by the first side surface 1c and the third side surface 1e when viewed from the first direction D1. The terminal electrode 12 is disposed at a corner portion defined by the second side surface 1d and the third side surface 1e when viewed from the first direction D1. The terminal electrode 13 is disposed at a corner portion defined by the first side surface 1c and the fourth side surface 1f when viewed from the first direction D1. The terminal electrode 14 is disposed at a corner portion defined by the second side surface 1d and the fourth side surface 1f when viewed from the first direction D1. Therefore, the terminal electrodes 11, 12, 13, and 14 are disposed at respective different corner portions of the first principal surface 1a, that is, at respective different corner portions of the element body 1 when viewed from the first direction D1.

The terminal electrode 15 is disposed at the center of the first principal surface 1a when viewed from the first direction D1. That is, the terminal electrode 15 is positioned at the inner side from the terminal electrodes 11, 12, 13, and 14 when viewed from the first direction D1. The area of the terminal electrode 15 is larger than the area of each of the terminal electrodes 11, 12, 13, and 14.

A plating layer may be formed on the surfaces of the terminal electrodes 11, 12, 13, 14, and 15. The plating layer is formed by, for example, electroplating. The plating layer has, for example, a layer structure including a Cu plating layer, a Ni plating layer, and a Sn plating layer, or a layer structure including a Ni plating layer and a Sn plating layer.

As illustrated in FIG. 2, the multilayer LC filter array FA1 includes a plurality of coil conductors 21, 22, 23, and 24. The coil conductors 21, 22, 23, and 24 each have an approximately annular shape. In the first embodiment, the coil conductors 21, 22, 23, and 24 each have a shape in which a conductor is wound almost one turn in a rectangular shape. The coil conductors 21, 22, 23, and 24 each contain a conductive material (for example, Ag or Pd). The coil conductors 21, 22, 23, and 24 each include a sintered body of a conductive paste containing a conductive material (for example, Ag powder, or Pd powder).

The coil conductor 21 and the coil conductor 22 are disposed in different positions (layers) in the first direction D1. That is, the coil conductor 21 and the coil conductor 22 are separated from each other in the first direction D1 with at least one layer of the insulator layers 5 therebetween. The coil conductor 22 is positioned closer to the second principal surface 1b than the coil conductor 21. The coil conductor 21 and the coil conductor 22 include conductor portions overlapping each other when viewed from the first direction D1. The coil conductor 21 includes a first end and a second end. The coil conductor 22 includes a first end and a second end.

The first end of the coil conductor 21 and the first end of the coil conductor 22 are connected to each other via a through-hole conductor 31. The through-hole conductor 31 penetrates the insulator layer 5 positioned between the coil conductor 21 and the coil conductor 22. The coil conductor 21 and the coil conductor 22 are electrically connected to each other through the through-hole conductor 31. As illustrated in FIG. 3, the coil conductor 21 and the coil conductor 22 constitute an inductor L1.

The coil conductor 23 and the coil conductor 24 are disposed in different positions (layers) in the first direction D1. That is, the coil conductor 23 and the coil conductor 24 are separated from each other in the first direction D1 with at least one layer of the insulator layers 5 therebetween. The coil conductor 24 is positioned closer to the second principal surface 1b than the coil conductor 23. The coil conductor 23 and the coil conductor 24 include conductor portions overlapping each other when viewed from the first direction D1. The coil conductor 23 includes a first end and a second end. The coil conductor 24 includes a first end and a second end.

The coil conductor 21 and the coil conductor 23 are disposed in the same position (layer) in the first direction D1. The coil conductor 21 and the coil conductor 23 are separated from each other in a direction in which the third side surface 1e and the fourth side surface 1f oppose each other. The coil conductor 21 is positioned closer to the third side surface 1e, and the coil conductor 23 is positioned closer to the fourth side surface 1f.

The coil conductor 22 and the coil conductor 24 are disposed in the same position (layer) in the first direction D1. The coil conductor 22 and the coil conductor 24 are separated from each other in the direction in which the third side surface 1e and the fourth side surface 1f oppose each other. The coil conductor 22 is positioned closer to the third side surface 1e, and the coil conductor 24 is positioned closer to the fourth side surface 1f.

The first end of the coil conductor 23 and the first end of the coil conductor 24 are connected to each other via a through-hole conductor 32. The through-hole conductor 32 penetrates one of the insulator layers 5 positioned between the coil conductor 23 and the coil conductor 24. The coil conductor 23 and the coil conductor 24 are electrically connected to each other through the through-hole conductor 32. As illustrated in FIG. 3, the coil conductor 23 and the coil conductor 24 constitute an inductor L2.

As illustrated in FIG. 2, the multilayer LC filter array FA1 includes a plurality of internal electrodes 41, 42, 43, 44, 45, and 46. The internal electrodes 41, 42, 43, 44, 45, and 46 each contain a conductive material (for example, Ag or Pd). The internal electrodes 41, 42, 43, 44, 45, and 46 each include a sintered body of a conductive paste containing a conductive material (for example, Ag powder or Pd powder).

The internal electrodes 41, 42, 43, and 44 are disposed in the same position (layer) in the first direction D1. The internal electrodes 41, 42, 43, and 44 are separated from each other in a plane orthogonal to the first direction D1. The internal electrode 41 is disposed closer to the corner portion defined by the first side surface 1c and the third side surface 1e when viewed from the first direction D1. The internal electrode 42 is disposed closer to the corner portion defined by the second side surface 1d and the third side surface 1e when viewed from the first direction D1. The internal electrode 43 is disposed closer to the corner portion defined by the first side surface 1c and the fourth side surface 1f when viewed from the first direction D1. The internal electrode 44 is disposed closer to the corner portion defined by the second side surface 1d and the fourth side surface 1f when viewed from the first direction D1.

The internal electrodes 41, 42, 43, and 44 are disposed in a position (layer) different from positions of the internal electrodes 45 and 46 in the first direction D1. The internal electrodes 41, 42, 43, and 44 are positioned between the internal electrode 45 and the internal electrode 46 in the first direction D1. The internal electrodes 41, 42, 43, and 44, and the internal electrode 45 are separated from each other in the first direction D1 with at least one layer of the insulator layers 5 therebetween. The internal electrodes 41, 42, 43, and 44, and the internal electrode 46 are separated from each other in the first direction D1 with at least one layer of the insulator layers 5 therebetween. The internal electrodes 41, 42, 43, and 44, and the internal electrodes 45 and 46 oppose each other in the first direction D1.

As illustrated in FIG. 3, the internal electrode 41 and the internal electrodes 45 and 46 constitute a capacitor C1. As illustrated in FIG. 3, the internal electrode 42 and the internal electrodes 45 and 46 constitute a capacitor C2. As illustrated in FIG. 3, the internal electrode 43 and the internal electrodes 45 and 46 constitute a capacitor C3. As illustrated in FIG. 3, the internal electrode 44 and the internal electrodes 45 and 46 constitute a capacitor C4.

The second end of the coil conductor 21, the internal electrode 41, and the terminal electrode 11 are positioned to overlap each other when viewed from the first direction D1. Between the second end of the coil conductor 21 and the internal electrode 41, two pad conductors 51 are disposed to overlap the second end of the coil conductor 21 and the internal electrode 41 when viewed from the first direction D1. Between the internal electrode 41 and the terminal electrode 11, two pad conductors 52 are disposed to overlap the internal electrode 41 and the terminal electrode 11 when viewed from the first direction D1. The two pad conductors 51 are separated from each other in the first direction D1 with the insulator layer 3 therebetween. The two pad conductors 52 are separated from each other in the first direction D1 with the insulator layer 3 therebetween.

The second end of the coil conductor 22, the internal electrode 42, and the terminal electrode 12 are positioned to overlap each other when viewed from the first direction D1. Between the second end of the coil conductor 22 and the internal electrode 42, three pad conductors 53 are disposed to overlap the second end of the coil conductor 22 and the internal electrode 42 when viewed from the first direction D1. Between the internal electrode 42 and the terminal electrode 12, two pad conductors 54 are disposed to overlap the internal electrode 42 and the terminal electrode 12 when viewed from the first direction D1. The three pad conductors 53 are separated from each other in the first direction D1 with the insulator layer 3 therebetween. The two pad conductors 54 are separated from each other in the first direction D1 with the insulator layer 3 therebetween.

The second end of the coil conductor 23, the internal electrode 43, and the terminal electrode 13 are positioned to overlap each other when viewed from the first direction D1. Between the second end of the coil conductor 23 and the internal electrode 43, two pad conductors 55 are disposed to overlap the second end of the coil conductor 23 and the internal electrode 43 when viewed from the first direction D1. Between the internal electrode 43 and the terminal electrode 13, two pad conductors 56 are disposed to overlap the internal electrode 43 and the terminal electrode 13 when viewed from the first direction D1. The two pad conductors 55 are separated from each other in the first direction D1 with the insulator layer 3 therebetween. The two pad conductors 56 are separated from each other in the first direction D1 with the insulator layer 3 therebetween.

The second end of the coil conductor 24, the internal electrode 44, and the terminal electrode 14 are positioned to overlap each other when viewed from the first direction D1. Between the second end of the coil conductor 24 and the internal electrode 44, three pad conductors 57 are disposed to overlap the second end of the coil conductor 24 and the internal electrode 44 when viewed from the first direction D1. Between the internal electrode 44 and the terminal electrode 14, two pad conductors 58 are disposed to overlap the internal electrode 44 and the terminal electrode 14 when viewed from the first direction D1. The three pad conductors 57 are separated from each other in the first direction D1 with the insulator layer 3 therebetween. The two pad conductors 58 are separated from each other in the first direction D1 with the insulator layer 3 therebetween.

The pad conductors 51 and 52 are disposed closer to the corner portion defined by the first side surface 1c and the third side surface 1e when viewed from the first direction D1. The pad conductors 53 and 54 are disposed closer to the corner portion defined by the second side surface 1d and the third side surface 1e when viewed from the first direction D1. The pad conductors 55 and 56 are disposed closer to the corner portion defined by the first side surface 1c and the fourth side surface 1f when viewed from the first direction D1. The pad conductors 57 and 58 are disposed closer to the corner portion defined by the second side surface 1d and the fourth side surface 1f when viewed from the first direction D1.

The pad conductors 51, 53, 55, and 57 positioned in the same layer as the internal electrode 45 are separated from the internal electrode 45. The pad conductors 52, 54, 56, and 58 positioned in the same layer as the internal electrode 46 are separated from the internal electrode 46.

Between the internal electrode 45 and the internal electrode 46, a pad conductor 59 is disposed to overlap the internal electrode 45 and the internal electrode 46 when viewed from the first direction D1. The pad conductor 59 is separated from the internal electrodes 41, 42, 43, and 44 positioned in the same layer as the pad conductor 59. The pad conductor 59 is separated from the internal electrode 45 in the first direction D1 with the insulator layer 3 therebetween. The pad conductor 59 is separated from the internal electrode 46 in the first direction D1 with the insulator layer 3 therebetween.

Between the internal electrode 46 and the terminal electrode 15, a pad conductor 60 is disposed to overlap the internal electrode 46 and the terminal electrode 15 when viewed from the first direction D1. The pad conductor 60 is separated from the internal electrode 46 in the first direction D1 with the insulator layer 3 therebetween. The pad conductor 60 is separated from the terminal electrode 15 in the first direction D1 with the insulator layer 3 therebetween.

The second end of the coil conductor 21, the internal electrode 41, and the terminal electrode 11 are electrically connected to each other through the pad conductors 51 and 52, and the through-hole conductor 33. Therefore, the inductor L1 and the capacitor C1 are connected to each other, and the inductor L1 and the capacitor C1 are connected to the terminal electrode 11. The through-hole conductor 33 penetrates the insulator layers 3 and 5 positioned between the coil conductor 21 and the terminal electrode 11.

The second end of the coil conductor 22, the internal electrode 42, and the terminal electrode 12 are electrically connected to each other through the pad conductors 53 and 54, and the through-hole conductor 34. Therefore, the inductor L1 and the capacitor C2 are connected to each other, and the inductor L1 and the capacitor C2 are connected to the terminal electrode 12. The through-hole conductor 34 penetrates the insulator layers 3 and 5 positioned between the coil conductor 22 and the terminal electrode 12.

The second end of the coil conductor 23, the internal electrode 43, and the terminal electrode 13 are electrically connected to each other through the pad conductors 55 and 56, and the through-hole conductor 35. Therefore, the inductor L2 and the capacitor C3 are connected to each other, and the inductor L2 and the capacitor C3 are connected to the terminal electrode 13. The through-hole conductor 35 penetrates the insulator layers 3 and 5 positioned between the coil conductor 23 and the terminal electrode 13.

The second end of the coil conductor 24, the internal electrode 44, and the terminal electrode 14 are electrically connected to each other through the pad conductors 57 and 58, and the through-hole conductor 36. Therefore, the inductor L2 and the capacitor C4 are connected to each other, and the inductor L2 and the capacitor C4 are connected to the terminal electrode 13. The through-hole conductor 36 penetrates the insulator layers 3 and 5 positioned between the coil conductor 24 and the terminal electrode 14.

The internal electrodes 45 and 46, and the terminal electrode 15 are electrically connected to each other through the pad conductors 59 and 60, and the through-hole conductor 37. Therefore, the capacitors C1, C2, C3, and C4 are connected to the terminal electrode 15. The through-hole conductor 37 penetrates the insulator layers 3 positioned between the internal electrode 45 and the terminal electrode 15.

The pad conductors 51, 52, 53, 54, 55, 56, 57, 58, 59, and 60, and the through-hole conductors 33, 34, 35, 36, and 37 each contain a conductive material (for example, Ag or Pd). The pad conductors 51, 52, 53, 54, 55, 56, 57, 58, 59, and 60, and the through-hole conductors 33, 34, 35, 36, and 37 each include a sintered body of a conductive paste containing a conductive material (for example, Ag powder or Pd powder). Through-hole conductors 33, 34, 35, 36, and 37 are formed by sintering a conductive paste that fills through-holes formed in a ceramic green sheet for forming corresponding insulator layers 3 and 5.

As also illustrated in FIG. 3, the multilayer LC filter array FA1 includes a filter F1 and a filter F2. The filter F1 includes the inductor L1 and the capacitors C1 and C2. The filter F2 includes the inductor L2 and the capacitors C3 and C4. Each of the filters F1 and F2 constitutes a π-type filter. The multilayer LC filter array FA1 includes two π-type filters.

As described above, in the first embodiment, the terminal electrodes 11, 12, 13, and 14 are disposed at the respective different corner portions of the element body 1 when viewed from the first direction D1, and the terminal electrode 15 is disposed at the center of the first principal surface 1a. Therefore, distances between the terminal electrode 15 and the terminal electrodes 11, 12, 13, and 14 are equivalent to each other. Consequently, in the multilayer LC filter array FA1, the terminal electrode 15 is common to the filter F1 and the filter F2, and parasitic inductances of the capacitors C1, C2, C3, and C4 are equivalent to each other.

In the first embodiment, the terminal electrodes 11, 12, 13, 14, and 15 are disposed only on the first principal surface 1a. Each of the terminal electrodes 11, 12, 13, 14, and 15 includes only an electrode portion disposed on the first principal surface 1a. The area of the terminal electrode 15 (electrode portion) is larger than the area of each of the terminal electrodes 11, 12, 13, and 14 (electrode portions). Therefore, the multilayer LC filter array FA1 improves mounting strength, and stabilizes the posture at the mounting, as compared with a multilayer LC filter array in which the area of the terminal electrode 15 is less than or equal to the area of each of the terminal electrodes 11, 12, 13, and 14.

As described above, the terminal electrodes 11, 12, 13, 14, and 15 are disposed only on the first principal surface 1a. The terminal electrodes 11, 12, 13, 14, and 15 are connected to the corresponding inductors L1 and L2, and the corresponding capacitors C1, C2, C3, and C4 via the through-hole conductors 33, 34, 35, and 36. Since the terminal electrodes 11, 12, 13, 14, and 15 are disposed only on the first principal surface 1a, the terminal electrodes 11, 12, 13, 14, and 15 are easily formed.

In the first embodiment, as described above, each of the filters F1 and F2 constitutes a π-type filter. Therefore, in the multilayer LC filter array FA1, a π-type LC filter array is implemented.

Figure 4:
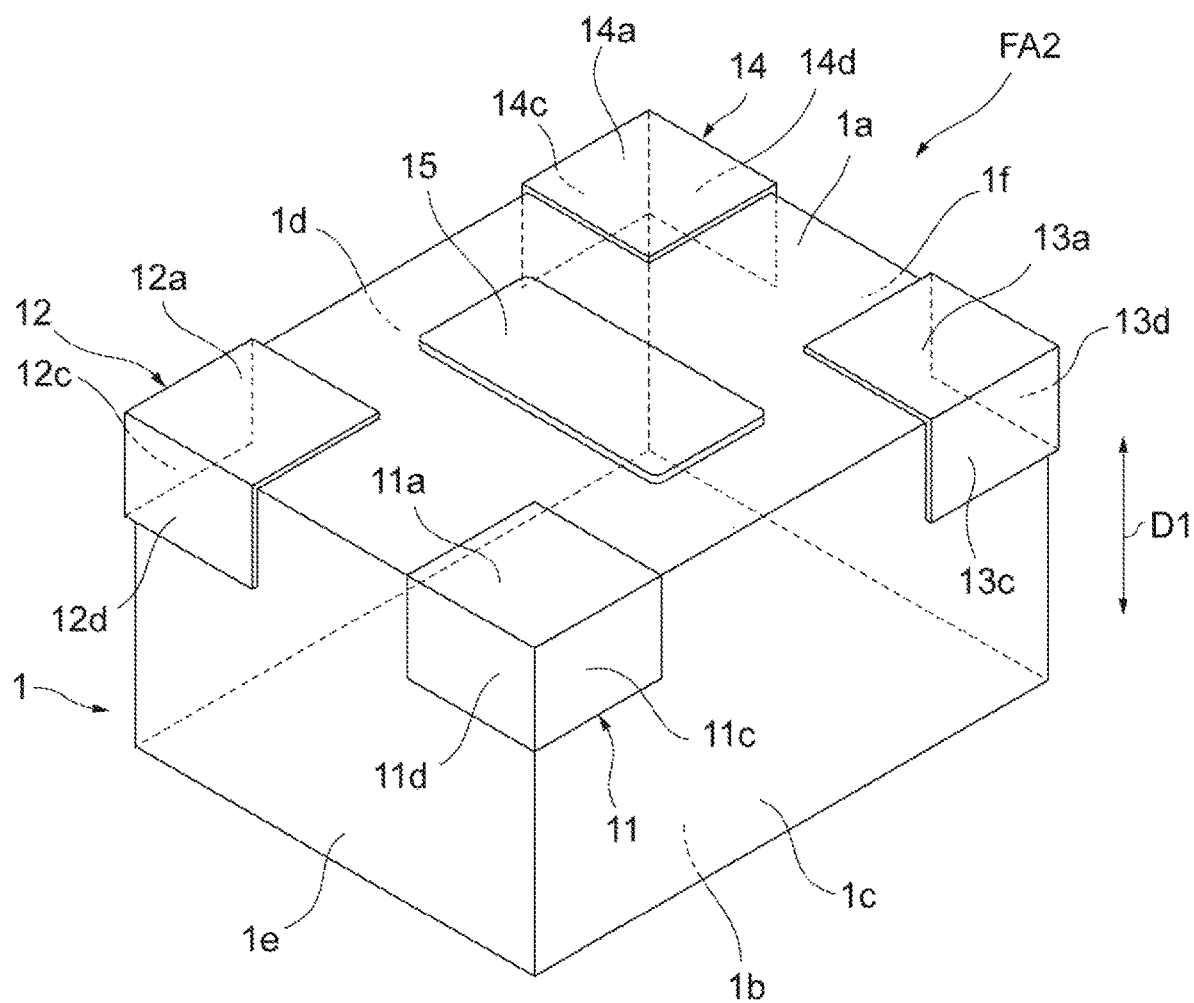
FIG. 4 is a perspective view illustrating a multilayer LC filter array according to a modification of the first embodiment.

Next, with reference to FIG. 4, a configuration will be described of a multilayer LC filter array FA2 according to a modification of the first embodiment. FIG. 4 is a perspective view illustrating the multilayer LC filter array according to the modification.

The multilayer LC filter array FA2 includes the element body 1 and the plurality of terminal electrodes 11, 12, 13, 14, and 15. The multilayer LC filter array FA2 differs from the multilayer LC filter array FA1 in shapes of the terminal electrodes 11, 12, 13, and 14. Although not illustrated, similarly to the multilayer LC filter array FA1, the multilayer LC filter array FA2 includes the plurality of coil conductors 21, 22, 23, and 24, and the plurality of internal electrodes 41, 42, 43, 44, 45 and 46 (see FIG. 2).

The terminal electrode 11 includes an electrode portion 11a disposed on the first principal surface 1a, an electrode portion 11c disposed on the first side surface 1c, and an electrode portion 11d disposed on the third side surface 1e. The terminal electrode 11 is disposed at a corner portion defined by the first principal surface 1a, the first side surface 1c, and the third side surface 1e. The electrode portions 11a, 11c, and 11d are integrally formed.

The terminal electrode 12 includes an electrode portion 12a disposed on the first principal surface 1a, an electrode portion 12c disposed on the second side surface 1d, and an electrode portion 12d disposed on the third side surface 1e. The terminal electrode 12 is disposed at a corner portion defined by the first principal surface 1a, the second side surface 1d, and the third side surface 1e. The electrode portions 12a, 12c, and 12d are integrally formed.

The terminal electrode 13 includes an electrode portion 13a disposed on the first principal surface 1a, an electrode portion 13c disposed on the first side surface 1c, and an electrode portion 13d disposed on the fourth side surface 1f. The terminal electrode 13 is disposed at a corner portion defined by the first principal surface 1a, the first side surface 1c, and the fourth side surface 1f. The electrode portions 13a, 13c, and 13d are integrally formed.

The terminal electrode 14 includes an electrode portion 14a disposed on the first principal surface 1a, an electrode portion 14c disposed on the second side surface 1d, and an electrode portion 14d disposed on the fourth side surface 1f. The terminal electrode 14 is disposed at a corner portion defined by the first principal surface 1a, the second side surface 1d, and the fourth side surface 1f. The electrode portions 14a, 14c, and 14d are integrally formed.

Also in the multilayer LC filter array FA2, the electrode portions 11a, 12a, 13a, and 14a are disposed at the respective different corner portions of the first principal surface 1a, that is, at the respective different corner portions of the element body 1 when viewed from the first direction D1. The terminal electrode 15 is disposed at the center of the first principal surface 1a. The terminal electrode 15 is positioned at the inner side from the electrode portions 11a, 12a, 13a, and 14a when viewed from the first direction D1.

In the multilayer LC filter array FA2, as in the multilayer LC filter array FA1, the terminal electrode 15 is common to the filter F1 and the filter F2, and the parasitic inductances of the capacitors C1, C2, C3, and C4 are equivalent to each other. The area of the terminal electrode 15 is larger than the area of each of the electrode portions 11a, 12a, 13a, and 14a. Therefore, the multilayer LC filter array FA2 improves mounting strength of the multilayer LC filter array FA2, and stabilizes the posture at the mounting of the multilayer LC filter array FA2.

Second Embodiment

Figure 5:
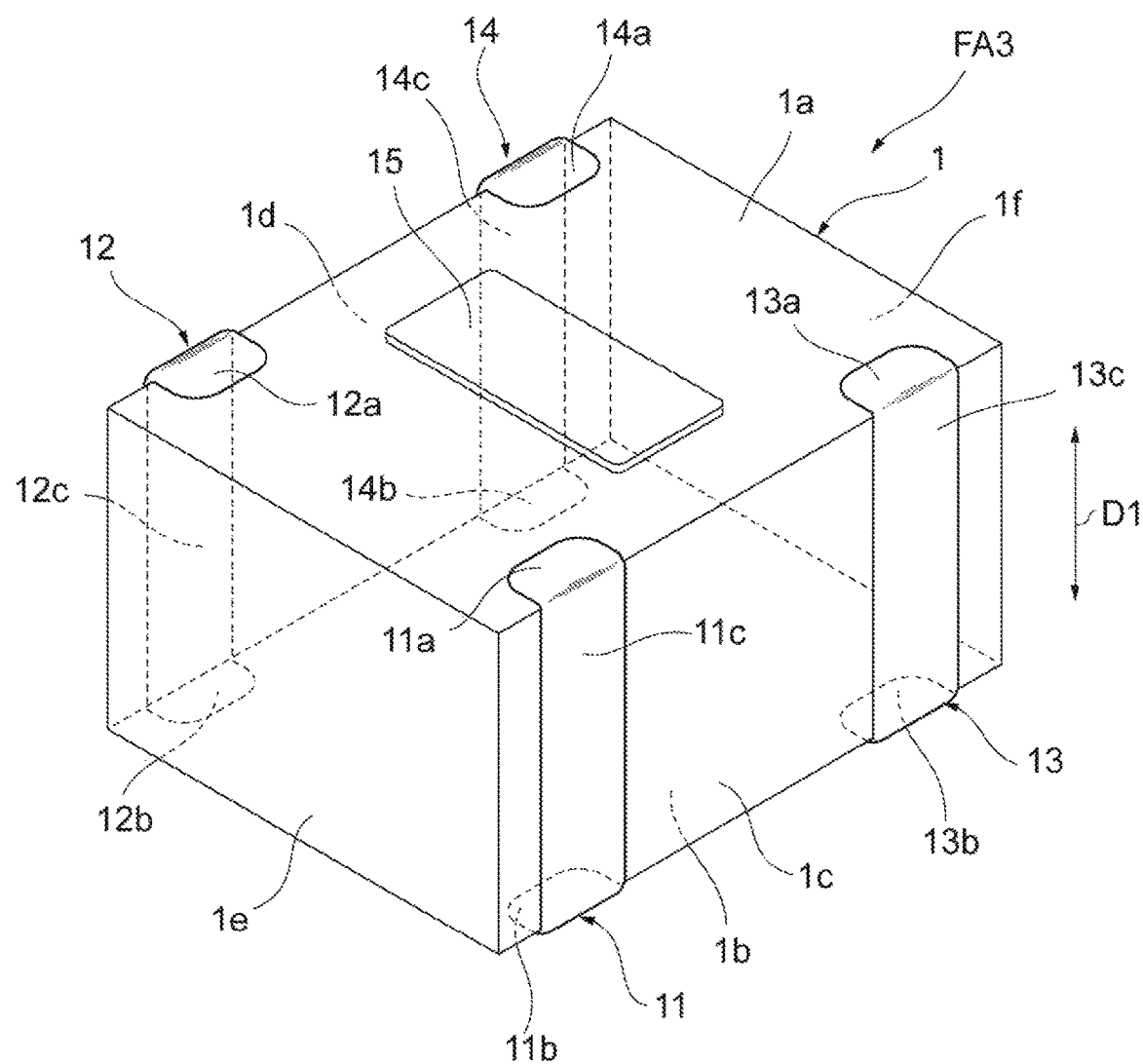
FIG. 5 is a perspective view illustrating a multilayer LC filter array according to a second embodiment.
Figure 6:
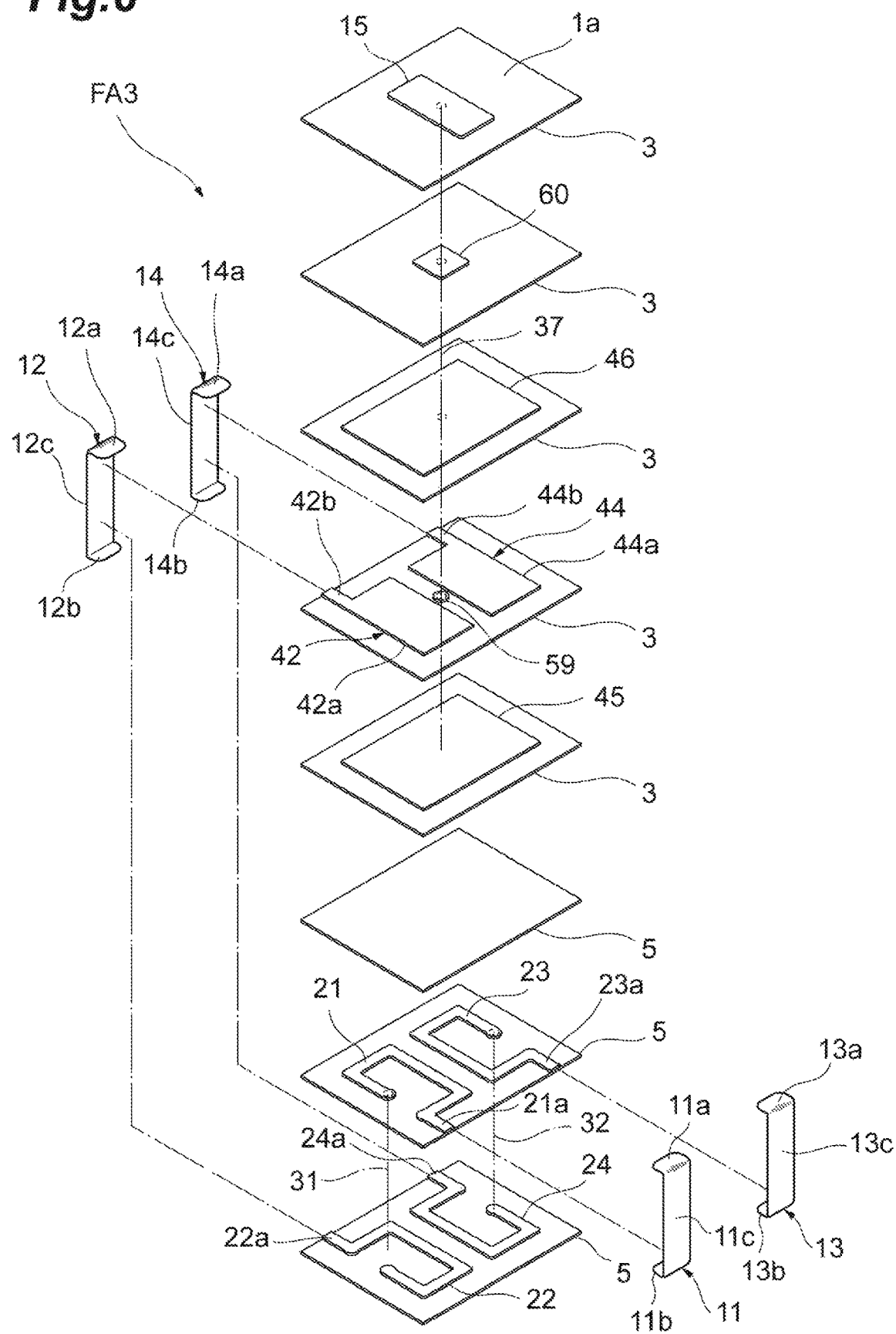
FIG. 6 is an exploded perspective view illustrating a configuration of the multilayer LC filter array according to the second embodiment.
Figure 7:
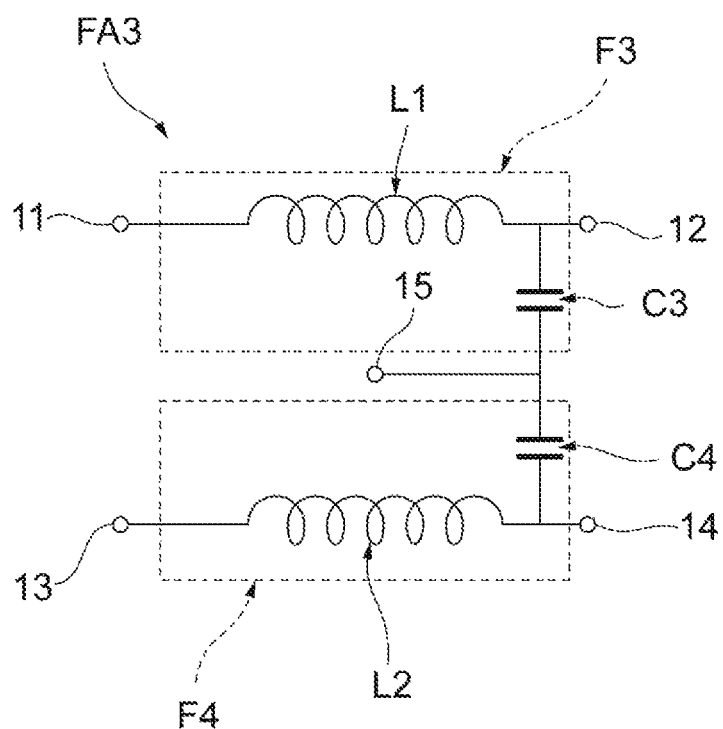
FIG. 7 is a diagram illustrating an equivalent circuit of the multilayer LC filter array according to the second embodiment.

With reference to FIGS. 5 to 7, a configuration will be described of a multilayer LC filter array FA3 according to a second embodiment. FIG. 5 is a perspective view illustrating the multilayer LC filter array according to the second embodiment. FIG. 6 is an exploded perspective view illustrating the configuration of the multilayer LC filter array according to the second embodiment. FIG. 7 is a diagram illustrating an equivalent circuit of the multilayer LC filter array according to the second embodiment.

As illustrated in FIG. 5, the multilayer LC filter array FA3 includes the element body 1 and a plurality of terminal electrodes 11, 12, 13, 14, and 15.

The terminal electrodes 11 and 13 are disposed on the first side surface 1c. The terminal electrode 11 is disposed at the corner portion defined by the first side surface 1c and the third side surface 1e. The terminal electrode 13 is disposed at the corner portion defined by the first side surface 1c and the fourth side surface 1f. The terminal electrode 11 includes an electrode portion 11a disposed on the first principal surface 1a, an electrode portion 11b disposed on the second principal surface 1b, and an electrode portion 11c disposed on the first side surface 1c. The terminal electrode 13 includes an electrode portion 13a disposed on the first principal surface 1a, an electrode portion 13b disposed on the second principal surface 1b, and an electrode portion 13c disposed on the first side surface 1c. The electrode portions 11a, 11b, and 11c are integrally formed, and the electrode portions 13a, 13b, and 13c are integrally formed.

The terminal electrodes 12 and 14 are disposed on the second side surface 1d. The terminal electrode 12 is disposed at the corner portion defined by the second side surface 1d and the third side surface 1e. The terminal electrode 14 is disposed at the corner portion defined by the second side surface 1d and the fourth side surface 1f. The terminal electrode 12 includes an electrode portion 12a disposed on the first principal surface 1a, an electrode portion 12b disposed on the second principal surface 1b, and an electrode portion 12c disposed on the second side surface 1d. The terminal electrode 14 includes an electrode portion 14a disposed on the first principal surface 1a, an electrode portion 14b disposed on the second principal surface 1b, and an electrode portion 14c disposed on the second side surface 1d. The electrode portions 12a, 12b, and 12c are integrally formed, and the electrode portions 14a, 14b, and 14c are integrally formed.

The electrode portions 11a, 12a, 13a, and 14a of the terminal electrodes 11, 12, 13, and 14 are disposed at the respective different corner portions of the first principal surface 1a, that is, at the respective different corner portions of the element body 1 when viewed from the first direction D1. The terminal electrode 15 is positioned at the inner side from the electrode portions 11a, 12a, 13a, and 14a when viewed from the first direction D1. The area of the terminal electrode 15 is larger than the area of each of the electrode portions 11a, 12a, 13a, and 14a.

As illustrated in FIG. 6, the multilayer LC filter array FA3 includes a plurality of coil conductors 21, 22, 23, and 24, and a plurality of internal electrodes 42, 44, 45, and 46. The internal electrode 42 is positioned closer to the third side surface 1e, and the internal electrode 44 is positioned closer to the fourth side surface 1f.

The coil conductor 21 includes, at its second end, a connecting portion 21a. The connecting portion 21a is exposed on the first side surface 1c. The connecting portion 21a, that is, the coil conductor 21 is connected to the terminal electrode 11 (electrode portion 11c) at the second end exposed to the first side surface 1c. The coil conductor 22 includes, at its second end, a connecting portion 22a. The connecting portion 22a is exposed on the second side surface 1d. The connecting portion 22a, that is, the coil conductor 22 is connected to the terminal electrode 12 (electrode portion 12c) at the second end exposed to the second side surface 1d.

The coil conductor 23 includes, at its second end, a connecting portion 23a. The connecting portion 23a is exposed on the first side surface 1c. The connecting portion 23a, that is, the coil conductor 23 is connected to the terminal electrode 13 (electrode portion 13c) at the second end exposed to the first side surface 1c. The coil conductor 24 includes, at its second end, a connecting portion 24a. The connecting portion 24a is exposed on the second side surface 1d. The connecting portion 24a, that is, the coil conductor 24 is connected to the terminal electrode 14 (electrode portion 14c) at the second end exposed to the second side surface 1d.

The internal electrode 42 includes a main electrode portion 42a opposing the internal electrodes 45 and 46, and a connecting portion 42b. The connecting portion 42b is exposed to the second side surface 1d. The connecting portion 42b is connected, at its one end exposed to the second side surface 1d, to the terminal electrode 12 (electrode portion 12c). The connecting portion 42b connects the main electrode portion 42a and the terminal electrode 12. The main electrode portion 42a and the connecting portion 42b are integrally formed.

The internal electrode 44 includes a main electrode portion 44a opposing the internal electrodes 45 and 46, and a connecting portion 44b. The connecting portion 44b is exposed to the second side surface 1d. The connecting portion 44b is connected, at its one end exposed to the second side surface 1d, to the terminal electrode 14 (electrode portion 14c). The connecting portion 44b connects the main electrode portion 44a and the terminal electrode 14. The main electrode portion 44a and the connecting portion 44b are integrally formed.

As also illustrated in FIG. 7, the multilayer LC filter array FA3 includes a filter F3 and a filter F4. The filter F3 includes the inductor L1 and the capacitor C2. The filter F4 includes the inductor L2 and the capacitor C4. Each of the filters F3 and F4 constitutes an L-type filter. The multilayer LC filter array FA3 includes two L-type filters.

As described above, in the second embodiment, the terminal electrodes 11, 12, 13, and 14 (the electrode portions 11a, 12a, 13a, and 14a) are disposed at the respective different corner portions of the element body 1 when viewed from the first direction D1, and the terminal electrode 15 is disposed at the center of the first principal surface 1a. Therefore, also in the multilayer LC filter array FA3, the distances between the terminal electrode 15 and the terminal electrodes 11, 12, 13, and 14 are equivalent to each other, similarly to the multilayer LC filter array FA1. Consequently, the terminal electrode 15 is common to the filter F3 and the filter F4, and the parasitic inductances of the capacitors C3 and C4 are equivalent to each other.

In the second embodiment, the terminal electrodes 11, 12, 13, and 14 include electrode portions 11a, 12a, 13a, and 14a disposed on the first principal surface 1a. The area of the terminal electrode 15 (electrode portion) is larger than the area of each of the electrode portions 11a, 12a, 13a, and 14a. Therefore, the multilayer LC filter array FA3 improves mounting strength of the multilayer LC filter array FA3, and stabilizes the posture at the mounting of the multilayer LC filter array FA3.

In the second embodiment, as described above, each of the filters F3 and F4 constitutes an L-type filter. Therefore, in the multilayer LC filter array FA3, an L-type LC filter array is implemented.

Figure 8:
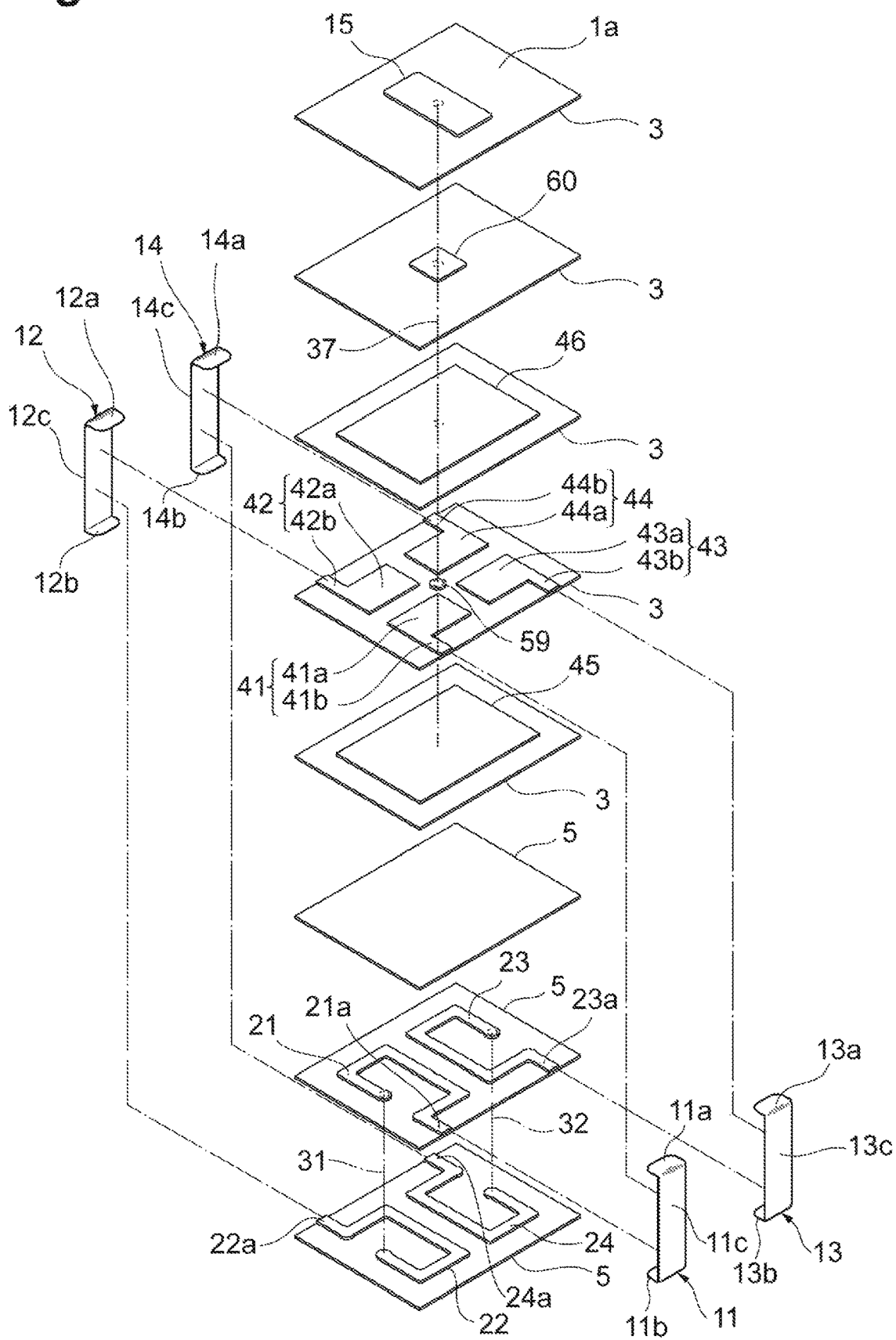
FIG. 8 is an exploded perspective view illustrating a configuration of a multilayer LC filter array according to a modification of the second embodiment.

Next, with reference to FIG. 8, a configuration will be described of a multilayer LC filter array according to a modification of the second embodiment. FIG. 8 is an exploded perspective view illustrating the configuration of the multilayer LC filter array according to the modification.

Although not illustrated, similarly to the multilayer LC filter array FA3 according to the second embodiment, the multilayer LC filter array according to the modification includes the element body 1 (see FIG. 5) and the plurality of terminal electrodes 11, 12, 13, 14, and 15 (see FIG. 5).

As illustrated in FIG. 8, the multilayer LC filter array according to the modification includes the plurality of coil conductors 21, 22, 23, and 24, and a plurality of internal electrodes 41, 42, 43, 44, 45, and 46. As in the multilayer LC filter array FA3, the internal electrodes 42 and 44 include main electrode portions 42a and 44a, and connecting portions 42b and 44b, respectively.

The internal electrode 41 includes a main electrode portion 41a opposing the internal electrodes 45 and 46, and a connecting portion 41b. The connecting portion 41b is exposed to the first side surface 1c. The connecting portion 41b is connected, at its one end exposed to the first side surface 1c, to the terminal electrode 11 (electrode portion 11c). The connecting portion 41b connects the main electrode portion 41a and the terminal electrode 11. The main electrode portion 41a and the connecting portion 41b are integrally formed.

The internal electrode 43 includes a main electrode portion 43a opposing the internal electrodes 45 and 46, and a connecting portion 43b. The connecting portion 43b is exposed to the first side surface 1c. The connecting portion 43b is connected, at its one end exposed to the first side surface 1c, to the terminal electrode 13 (electrode portion 13c). The connecting portion 43b connects the main electrode portion 43a and the terminal electrode 13. The main electrode portion 43a and the connecting portion 43b are integrally formed.

Similarly to the multilayer LC filter array FA1, the multilayer LC filter array according to the modification includes a filter including the inductor L1 and the capacitors C1 and C2, and a filter including the inductor L2 and the capacitors C3 and C4. Each of the filters constitutes a π-type filter. The multilayer LC filter array according to the modification includes two π-type filters.

Figure 9:
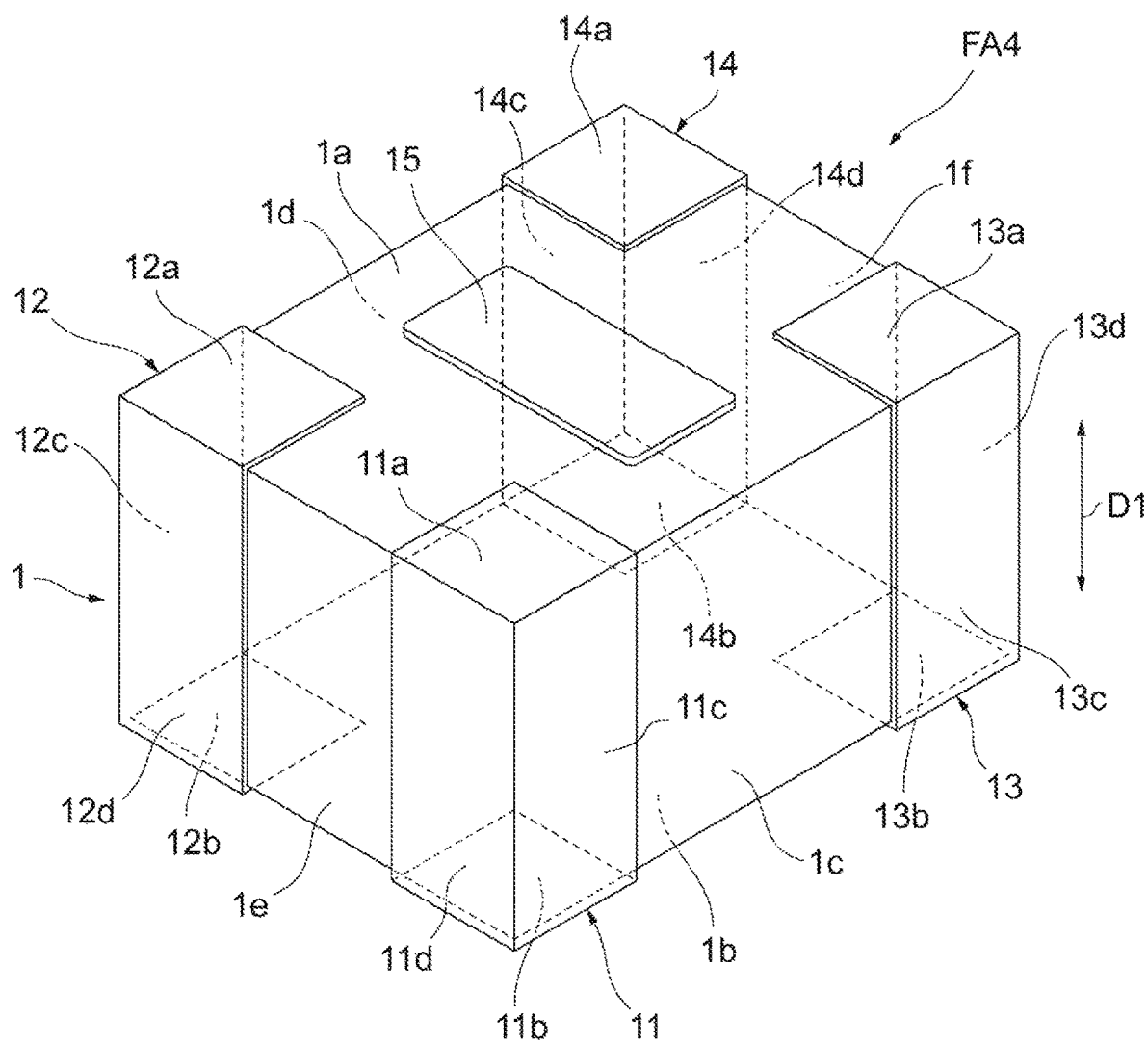
FIG. 9 is a perspective view illustrating a multilayer LC filter array according to another modification of the second embodiment.

Next, with reference to FIG. 9, a configuration will be described of a multilayer LC filter array FA4 according to another modification of the second embodiment. FIG. 9 is a perspective view illustrating the multilayer LC filter array according to the modification.

The multilayer LC filter array FA4 includes an element body 1 and a plurality of terminal electrodes 11, 12, 13, 14, and 15. The multilayer LC filter array FA4 differs from the multilayer LC filter array FA3 and the multilayer LC filter array according to the modification illustrated in FIG. 8 in shapes of the terminal electrodes 11, 12, 13, and 14.

The terminal electrode 11 includes an electrode portion 11a disposed on the first principal surface 1a, an electrode portion 11b disposed on the second principal surface 1b, an electrode portion 11c disposed on the first side surface 1c, and an electrode portion 11d disposed on the third side surface 1e. The terminal electrode 11 is disposed at the corner portion defined by the first side surface 1c and the third side surface 1e. The electrode portions 11a, 11b, 11c, and 11d are integrally formed.

The terminal electrode 12 includes an electrode portion 12a disposed on the first principal surface 1a, an electrode portion 12b disposed on the second principal surface 1b, an electrode portion 12c disposed on the second side surface 1d, and an electrode portion 12d disposed on the third side surface 1e. The terminal electrode 12 is disposed at the corner portion defined by the second side surface 1d and the third side surface 1e. The electrode portions 12a, 12b, 12c, and 12d are integrally formed.

The terminal electrode 13 includes an electrode portion 13a disposed on the first principal surface 1a, an electrode portion 13b disposed on the second principal surface 1b, an electrode portion 13c disposed on the first side surface 1c, and an electrode portion 13d disposed on the fourth side surface 1f. The terminal electrode 13 is disposed at the corner portion defined by the first side surface 1c and the fourth side surface 1f. The electrode portions 13a, 13b, 13c, and 13d are integrally formed.

The terminal electrode 14 includes an electrode portion 14a disposed on the first principal surface 1a, an electrode portion 14b disposed on the second principal surface 1b, an electrode portion 14c disposed on the second side surface 1d, and an electrode portion 14d disposed on the fourth side surface 1f. The terminal electrode 14 is disposed at the corner portion defined by the second side surface 1d and the fourth side surface 1f. The electrode portions 14a, 14b, 14c, and 14d are integrally formed.

Also in the multilayer LC filter array FA4, the electrode portions 11a, 12a, 13a, and 14a are disposed at the respective different corner portions of the first principal surface 1a, that is, at the respective different corner portions of the element body 1 when viewed from the first direction D1. The terminal electrode 15 is positioned at the inner side from the electrode portions 11a, 12a, 13a, and 14a when viewed from the first direction D1. The area of the terminal electrode 15 is larger than the area of each of the electrode portions 11a, 12a, 13a, and 14a.

Also in the modifications illustrated in FIGS. 8 and 9, the terminal electrode 15 is common to the filter F1 and the filter F2, and the parasitic inductances of the capacitors C1, C2, C3, and C4 are equivalent to each other. Each of the modifications improves mounting strength of the multilayer LC filter array, and stabilizes the posture at the mounting of the multilayer LC filter array.

Although the embodiments and modifications of the present invention have been described above, the present invention is not necessarily limited to the embodiments and modifications, and the embodiment can be variously changed without departing from the scope of the invention.

For example, the number of the coil conductors 21, 22, 23, and 24 constituting the inductors L1 and L2 is not limited to "2" but may be "3" or more. For example, the number (number of laminated layers) of the internal electrodes 41, 42, 43, 44, 45, and 46 forming the capacitors C1, C2, C3, and C4 is not limited to "3" but may be "4" or more.

Figure 10:
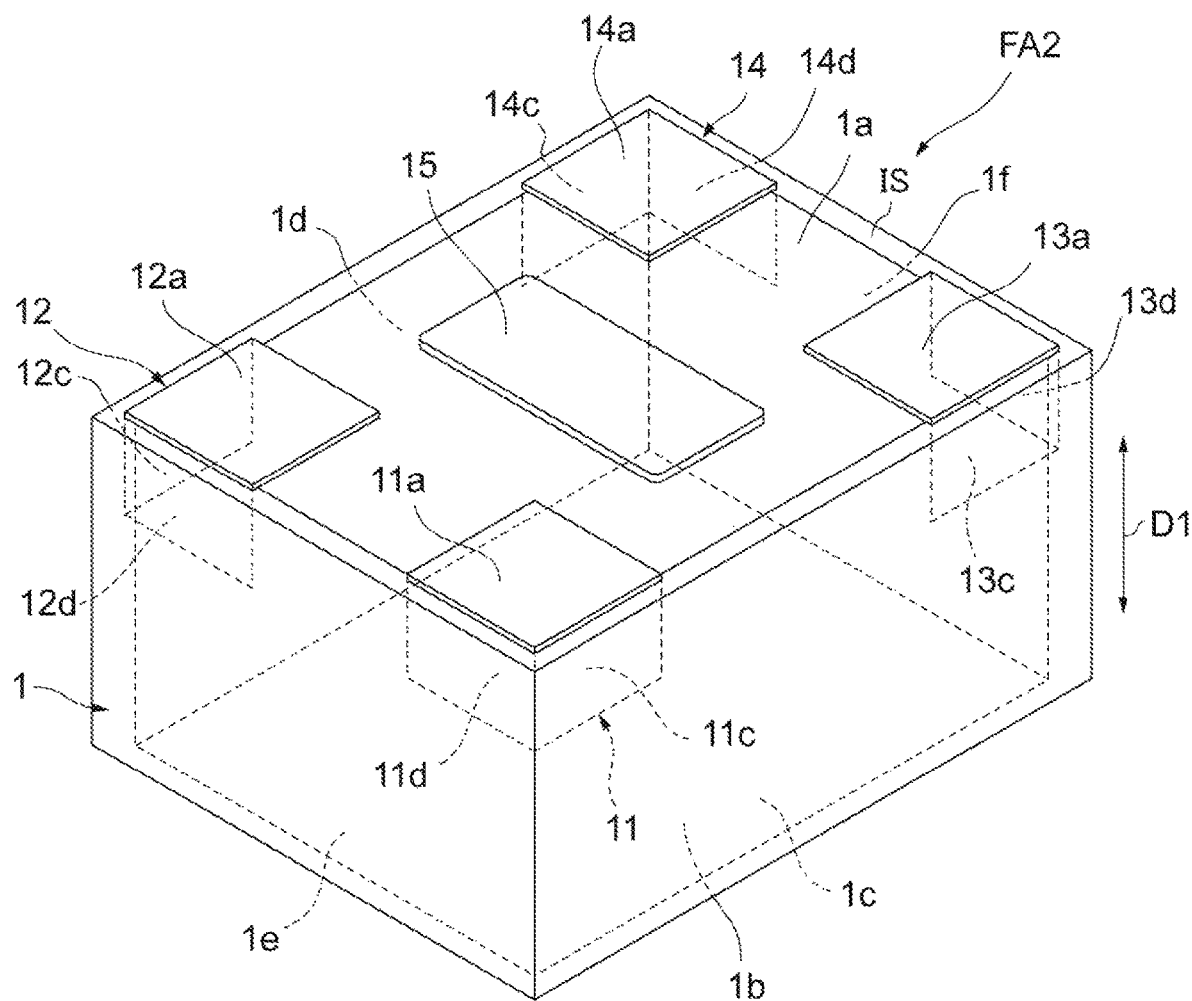
FIG. 10 is a perspective view illustrating a multilayer LC filter array according to another modification.
Figure 11:
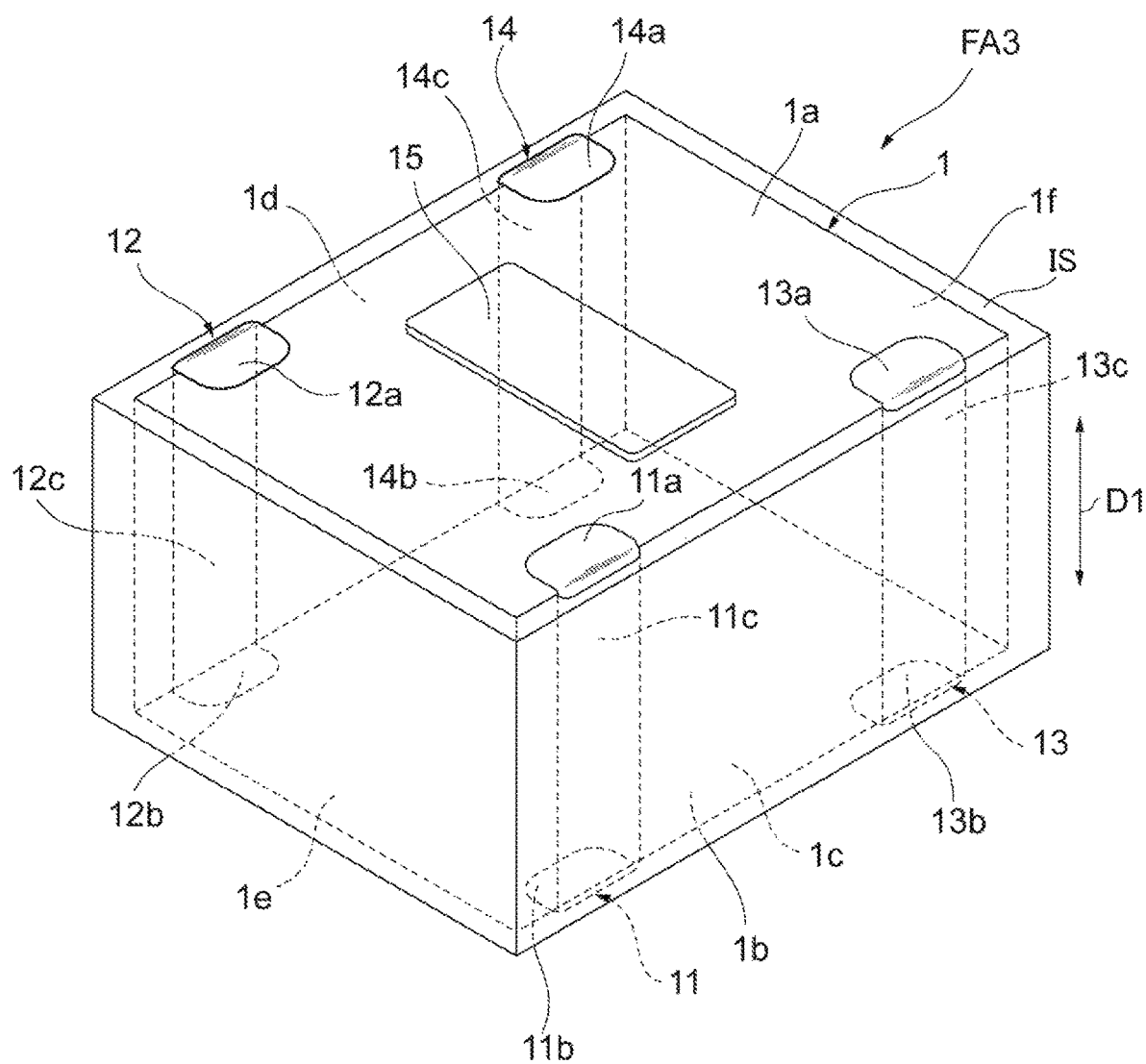
FIG. 11 is a perspective view illustrating a multilayer LC filter array according to another modification.
Figure 12:
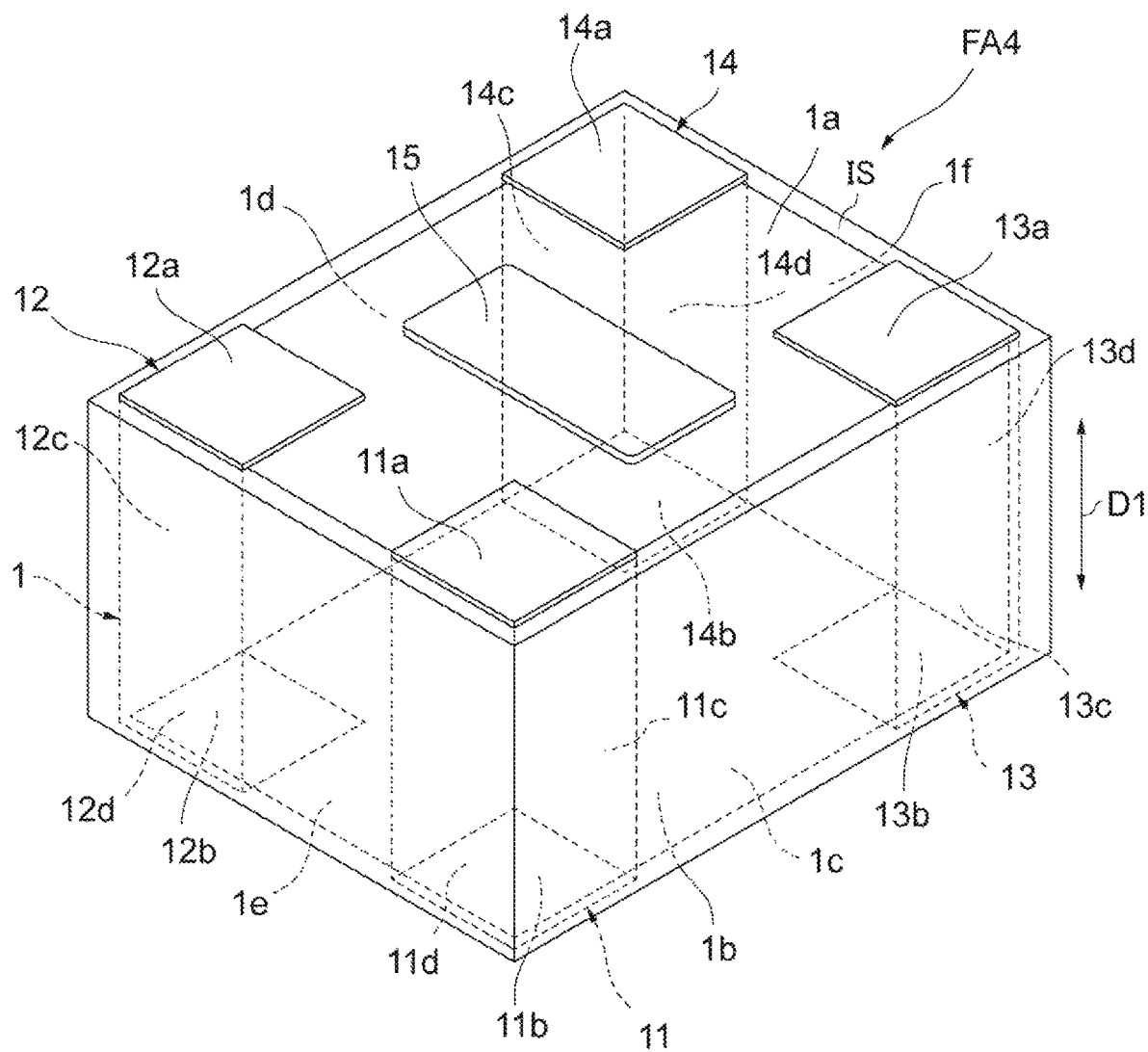
FIG. 12 is a perspective view illustrating a multilayer LC filter array according to another modification.

As illustrated in FIGS. 10 to 12, the multilayer LC filter arrays FA2, FA3, and FA4 each may include an insulator IS. The insulator IS includes an electrically insulating material (for example, insulating resin or insulating glass). FIGS. 10 to 12 each are a perspective view illustrating a modification of the multilayer LC filter array.

In the multilayer LC filter array FA2 illustrated in FIG. 10, the insulator IS covers the electrode portions 11c and 13c disposed on the first side surface 1c, the electrode portions 12c and 14c disposed on the second side surface 1d, the electrode portions 11d and 12d disposed on the third side surface 1e, and the electrode portions 13d and 14d disposed on the fourth side surface 1f. The insulator IS also covers a region exposed from the electrode portions 11c and 13c in the first side surface 1c, a region exposed from the electrode portions 12c and 14c in the second side surface 1d, a region exposed from the electrode portions 11d and 12d in the third side surface 1e, and a region exposed from the electrode portions 13d and 14d in the fourth side surface 1f.

The terminal electrode 15 and electrode portions 11a, 12a, 13a, and 14a disposed on the first principal surface 1a are exposed from the insulator IS. A region exposed from the terminal electrode 15 and electrode portions 11a, 12a, 13a, and 14a in the first principal surface 1a is exposed from the insulator IS. The second principal surface 1b is also exposed from the insulator IS.

In the multilayer LC filter array FA3 illustrated in FIG. 11, the insulator IS covers the electrode portions 11c and 13c disposed on the first side surface 1c, and the electrode portions 12c and 14c disposed on the second side surface 1d. The insulator IS also covers a region exposed from the electrode portions 11c and 13c in the first side surface 1c, a region exposed from the electrode portions 12c and 14c in the second side surface 1d, the third side surface 1e, and the fourth side surface 1f. The terminal electrode 15 and electrode portions 11a, 12a, 13a, and 14a disposed on the first principal surface 1a are exposed from the insulator IS.

The electrode portions 11b, 12b, 13b, and 14b disposed on the second principal surface 1b are also exposed from the insulator IS. A region exposed from the terminal electrode 15 and electrode portions 11a, 12a, 13a, and 14a in the first principal surface 1a, and a region exposed from the electrode portions 11b, 12b, 13b, and 14b in the second principal surface 1b are also exposed from the insulator IS.

In the multilayer LC filter array FA4 illustrated in FIG. 12, the insulator IS covers the electrode portions 11c and 13c disposed on the first side surface 1c, the electrode portions 12c and 14c disposed on the second side surface 1d, the electrode portions 11d and 12d disposed on the third side surface 1e, and the electrode portions 13d and 14d disposed on the fourth side surface 1f. The insulator IS also covers a region exposed from the electrode portions 11c and 13c in the first side surface 1c, a region exposed from the electrode portions 12c and 14c in the second side surface 1d, a region exposed from the electrode portions 11d and 12d in the third side surface 1e, and a region exposed from the electrode portions 13d and 14d in the fourth side surface 1f.

The terminal electrode 15 and electrode portions 11a, 12a, 13a, and 14a disposed on the first principal surface 1a, and the electrode portions 11b, 12b, 13b, and 14b disposed on the second principal surface 1b are also exposed from the insulator IS. A region exposed from the terminal electrode 15 and electrode portions 11a, 12a, 13a, and 14a in the first principal surface 1a, and a region exposed from the electrode portions 11b, 12b, 13b, and 14b in the second principal surface 1b are also exposed from the insulator IS.

When the multilayer LC filter arrays FA2 and FA4 illustrated in FIGS. 10 and 12 are solder-mounted, solder fillets tend not to be formed on the first to fourth side surfaces 1c, 1d, 1e, and if sides of the element body 1. When the multilayer LC filter array FA3 illustrated in FIG. 11 is solder-mounted, solder fillets tend not to be formed on the first and second side surfaces 1c and 1d sides of the element body 1. Therefore, the modifications illustrated in FIGS. 10 to 12 enable close adjacent high-density mounting of the multilayer LC filter arrays FA2, FA3, and FA4.

INDUSTRIAL APPLICABILITY

The present invention can be applied to a π-type LC filter array or an L-type LC filter array.

REFERENCE SIGNS LIST 1 element body
1a first principal surface
1b second principal surface
3, 5 insulator layer
11, 12, 13, 14, 15 terminal electrode
11a, 11b, 11c, 11d, 12a, 12b, 12c, 12d, 13a, 13b, 13c, 13d, 14a, 14b, 14c, 14d electrode portion
33, 34, 35, 36, 37 through-hole conductor
C1, C2, C3, C4 capacitor
F1, F2, F3, F4 filter
FA1, FA2, FA3, FA4 multilayer LC filter array
IS insulator
L1, L2 inductor

The invention claimed is:

1. A multilayer LC filter array, comprising:
an element body of a rectangular parallelepiped shape including a plurality of insulator layers laminated;
a first filter including a first inductor and a first capacitor that are disposed in the element body;
a second filter including a second inductor and a second capacitor that are disposed in the element body;
a first input terminal electrode and a first output terminal electrode that are connected to the first inductor;
a second input terminal electrode and a second output terminal electrode that are connected to the second inductor; and
a ground terminal electrode that is connected to the first capacitor and the second capacitor, wherein
the element body includes first and second principal surfaces opposing each other in a direction in which the plurality of insulator layers is laminated,
the ground terminal electrode is disposed at a center of the first principal surface,
the first input terminal electrode, the first output terminal electrode, the second input terminal electrode, and the second output terminal electrode are disposed at respective different corner portions of the element body when viewed from a direction orthogonal to the first principal surface, and
the first input terminal electrode, the first output terminal electrode, the second input terminal electrode, and the second output terminal electrode each include a first electrode portion disposed on the first principal surface, and
an area of the ground terminal electrode is larger than an area of each of the first electrode portions.

2. The multilayer LC filter array according to claim 1, wherein
the first filter further includes a third capacitor, the second filter further includes a fourth capacitor,
the first capacitor is connected to the first input terminal electrode, and the third capacitor is connected to the first output terminal electrode, and
the second capacitor is connected to the second input terminal electrode, and the fourth capacitor is connected to the second output terminal electrode.

3. The multilayer LC filter array according to claim 1, wherein
the first input terminal electrode, the first output terminal electrode, the second input terminal electrode, and the second output terminal electrode are disposed only on the first principal surface, and
the first input terminal electrode, the first output terminal electrode, the second input terminal electrode, and the second output terminal electrode are connected to the corresponding first and second inductors and first and second capacitors via respective through-hole conductors.

4. The multilayer LC filter array according to claim 1, wherein
the element body further includes four side surfaces,
the first input terminal electrode, the first output terminal electrode, the second input terminal electrode, and the second output terminal electrode each further include a second electrode portion disposed on a corresponding one of the side surfaces, and
each of the second electrode portions is covered with an insulator.

5. A multilayer LC filter array, comprising:
an element body of a rectangular parallelepiped shape including a plurality of insulator layers laminated;
a first filter including a first inductor and a first capacitor that are disposed in the element body;
a second filter including a second inductor and a second capacitor that are disposed in the element body;
a first input terminal electrode and a first output terminal electrode that are connected to the first inductor;
a second input terminal electrode and a second output terminal electrode that are connected to the second inductor; and
a ground terminal electrode that is connected to the first capacitor and the second capacitor, wherein
the element body includes first and second principal surfaces opposing each other in a direction in which the plurality of insulator layers is laminated,
the ground terminal electrode is disposed at a center of the first principal surface,
the first input terminal electrode, the first output terminal electrode, the second input terminal electrode, and the second output terminal electrode are disposed at respective different corner portions of the element body when viewed from a direction orthogonal to the first principal surface,
the element body further includes four side surfaces,
the first input terminal electrode, the first output terminal electrode, the second input terminal electrode, and the second output terminal electrode each further include a second electrode portion disposed on a corresponding one of the side surfaces, and
each of the second electrode portions is covered with an insulator.

6. The multilayer LC filter array according to claim 5, wherein
the first filter further includes a third capacitor,
the second filter further includes a fourth capacitor,
the first capacitor is connected to the first input terminal electrode, and the third capacitor is connected to the first output terminal electrode, and
the second capacitor is connected to the second input terminal electrode, and the fourth capacitor is connected to the second output terminal electrode.

7. A multilayer LC filter array, comprising:
an element body of a rectangular parallelepiped shape including a plurality of insulator layers laminated;
a first filter including a first inductor and a first capacitor that are disposed in the element body;
a second filter including a second inductor and a second capacitor that are disposed in the element body;
a first input terminal electrode and a first output terminal electrode that are connected to the first inductor;
a second input terminal electrode and a second output terminal electrode that are connected to the second inductor; and
a ground terminal electrode that is connected to the first capacitor and the second capacitor, wherein
the element body includes first and second principal surfaces opposing each other in a direction in which the plurality of insulator layers is laminated,
the ground terminal electrode is disposed at a center of the first principal surface,
the first input terminal electrode, the first output terminal electrode, the second input terminal electrode, and the second output terminal electrode are disposed at respective different corner portions of the element body when viewed from a direction orthogonal to the first principal surface,
the first filter further includes a third capacitor,
the second filter further includes a fourth capacitor,
the first capacitor is connected to the first input terminal electrode, and the third capacitor is connected to the first output terminal electrode, and
the second capacitor is connected to the second input terminal electrode, and the fourth capacitor is connected to the second output terminal electrode.

8. The multilayer LC filter array according to claim 7, wherein
the first input terminal electrode, the first output terminal electrode, the second input terminal electrode, and the second output terminal electrode are disposed only on the first principal surface, and
the first input terminal electrode, the first output terminal electrode, the second input terminal electrode, and the second output terminal electrode are connected to the corresponding first and second inductors and first and second capacitors via respective through-hole conductors.

* * * * *